（12） United States Patent
Yamagami

(10) Patent No.: US 6,999,367 B2
(45) Date of Patent: Feb. 14, 2006

(54) SEMICONDUCTOR MEMORY DEVICE

(75) Inventor: Yoshinobu Yamagami, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/917,308

(22) Filed: Aug. 13, 2004

(65) Prior Publication Data

US 2005/0047220 A1 Mar. 3, 2005

(30) Foreign Application Priority Data

Aug. 29, 2003 (JP) ............................. 2003-307697

(51) Int. Cl.
*G11C 7/02* (2006.01)
*G11C 11/40* (2006.01)
(52) U.S. Cl. ...................... 365/210; 365/156; 365/190
(58) Field of Classification Search ..................... None
See application file for complete search history.

(56) References Cited

U.S. PATENT DOCUMENTS

| | | | | |
|---|---|---|---|---|
| 4,712,194 A | * | 12/1987 | Yamaguchi et al. | ........ 365/203 |
| 5,043,945 A | * | 8/1991 | Bader | ........... 365/190 |
| 5,495,449 A | * | 2/1996 | Park | ............ 365/203 |
| 5,946,264 A | * | 8/1999 | McClure | ............. 365/230.06 |
| 6,088,279 A | * | 7/2000 | Ishii | ............. 365/210 |
| 6,130,846 A | * | 10/2000 | Hori et al. | ................... 365/203 |
| 6,333,881 B1 | * | 12/2001 | Kusunoki et al. | ........... 365/203 |

FOREIGN PATENT DOCUMENTS

| | | |
|---|---|---|
| JP | 11-096768 | 4/1999 |
| JP | 2002-367377 A | 12/2002 |

\* cited by examiner

*Primary Examiner*—Son Mai
(74) *Attorney, Agent, or Firm*—McDermott Will & Emery LLP

(57) ABSTRACT

A semiconductor memory device includes word lines, bit line pairs, memory cells 1, bit line precharge circuits 2, and write amplifiers 3, as well as a dummy word line, a dummy bit line pair, dummy memory cells 1a, 1b, and 1c, and a memory cell storing node detection circuit 6. Through the action of the dummy memory cells 1b and 1c, it is ensured that the write timing for the dummy memory cell 1a is substantially identical to the write timing for the memory cells 1. Based on changes in the states of storing nodes S1 and S2 included in the dummy memory cell 1a, the memory cell storing node detection circuit 6 generates a write completion signal WRST. As a result, a semiconductor memory device having an optimized write timing and low power consumption is provided.

11 Claims, 6 Drawing Sheets

SEMICONDUCTOR MEMORY DEVICE

BACKGROUND OF THE INVENTION

1. Field of the Invention

The present invention relates to a semiconductor memory device, and more particularly to a semiconductor memory device incorporating dummy memory cells.

2. Description of the Background Art

In a semiconductor memory device in general, when data is to be written to a memory cell, a bit line pair leaves a precharged state, and a selected bit line pair as well as a write amplifier which is connected to a selected word line are turned on. After completing the data write, the semiconductor memory device turns the selected word line and write amplifier off, and places the bit line pair back in a precharged state.

FIG. 8 is a structural diagram showing a conventional semiconductor memory device. The semiconductor memory device shown in FIG. 8 comprises memory cells 1, bit line precharge circuits 2, write amplifiers 3, and a write amplifier control circuit 4. The write amplifier control circuit 4 includes a 2-input AND circuit MA1 and a delay circuit 5. In FIG. 8 are shown: word lines WL1 and WL2; a bit line pair BL1 and /BL1, and a bit line pair BL2 and /BL2; a bit line precharge control signal PCG; a write enable signal WEN; a write amplifier control signal WAE; column selection signals CA1 and CA2; and write data IN1 and IN2.

As shown in FIG. 8, each memory cell 1 is connected to one word line and one bit line pair. FIG. 9 is a circuit diagram showing a detailed structure of the memory cell 1. The memory cell 1 shown in FIG. 9 comprises access transistors Q1 and Q2, drive transistors Q3 and Q4, and load transistors Q5 and Q6. In FIG. 9 are shown: a word line WL; a bit line pair BL and /BL; memory cell storing nodes S1 and S2; and power terminals VDD. Gate terminals of the access transistors Q1 and Q2 are connected to the word line WL; drain terminals of the access transistors Q1 and Q2 are connected to the respective bit lines BL and /BL of the bit line pair; and source terminals of the access transistors Q1 and Q2 are connected to the memory cell storing nodes S1 and S2, respectively.

The drive transistor Q3 and the load transistor Q5 together compose a first inverter. The drive transistor Q4 and the load transistor Q6 together compose a second inverter. The output terminal of the first inverter (memory cell storing node S2) is connected to an input terminal of the second inverter. The output terminal of the second inverter (memory cell storing node S1) is connected to an input terminal of the first inverter. Thus, the first and second inverters together compose a latch circuit for storing and retaining data. When the word line WL is at an H (High) level, the memory cell 1 either performs an operation of inputting incoming complementary data which is transmitted via the bit line pair {BL and /BL}, or an operation of outputting the data stored at the memory cell storing nodes S1 and S2 onto the bit line pair {BL and /BL}.

FIG. 10 is a circuit diagram showing the detailed structure of the bit line precharge circuit 2. The bit line precharge circuit 2 shown in FIG. 10 includes precharge transistors Q7 and Q8 and an equalization transistor Q9. In FIG. 10 are shown: a bit line pair BL and /BL; a bit line precharge control signal PCG; and power terminals VDD.

To gate terminals of the precharge transistors Q7 and Q8 and the equalization transistor Q9, the bit line precharge control signal PCG is applied. Drain terminals of the precharge transistors Q7 and Q8 are connected to the respective bit lines BL and /BL of the bit line pair; and source terminals of the precharge transistors Q7 and Q8 are connected to the power terminals VDD. A source terminal and a drain terminal of the equalization transistor Q9 are connected to the respective bit lines BL and /BL of the bit line pair.

When the bit line precharge control signal PCG is at an L (Low) level, the bit line precharge circuit 2 takes an active state, and precharges the bit line pair {BL and /BL} to an H level (VDD level). On the other hand, when the bit line precharge control signal PCG is at an H level, the bit line precharge circuit 2 takes an inactive state, and the bit line pair {BL and /BL} takes a high-impedance state.

FIG. 11 is a circuit diagram showing a detailed structure of the write amplifier 3. The write amplifier 3 shown in FIG. 11 comprises p-MOS transistors QP1 and QP2, n-MOS transistors QN1 and QN2, inverters MI1 to MI3, and 3-input NAND circuits MN1 and MN2. In FIG. 11 are shown: a bit line pair BL and /BL; a column selection signal CA; a write amplifier control signal WAE; write data IN; and power terminals VDD.

Source terminals of the p-MOS transistors QP1 and QP2 are connected to the power terminals VDD, and source terminals of the n-MOS transistors QN1 and QN2 are both grounded. Drain terminals of the p-MOS transistor QP1 and the n-MOS transistor QN1 are connected to the bit line BL of the bit line pair. Drain terminals of the p-MOS transistor QP2 and the n-MOS transistor QN2 are connected to the bit line /BL of the bit line pair.

To the three input terminals of the 3-input NAND circuit MN1, the column selection signal CA, the write amplifier control signal WAE, and an output from the inverter MI3, whose own input terminal receives the write data IN, are applied. An output from the 3-input NAND circuit MN1 is applied to a gate terminal of the p-MOS transistor QP2 and an input terminal of the inverter MI1. To the three input terminals of the 3-input NAND circuit MN2, the column selection signal CA, the write amplifier control signal WAE, and the write data IN are applied. An output from the 3-input NAND circuit MN2 is applied to a gate terminal of the p-MOS transistor QP1 and an input terminal of the inverter MI2. Outputs from the inverters MI1 and MI2 are applied to the gate terminals of the n-MOS transistors QN1 and QN2, respectively.

When performing a write operation, the write amplifier control signal WAE takes an H level only for the duration of a write time (described later). The write amplifier 3 takes an active state when the column selection signal CA and the write amplifier control signal WAE are both at an H level, and outputs data which is in accordance with the write data IN (H level or L level) to the bit line pair {BL and /BL}. For example, in the case where the column selection signal CA and the write amplifier control signal WAE are both at the H level and the write data IN is at the H level, the output of the 3-input NAND circuit MN1 is at the H level, and the output of the 3-input NAND circuit MN2 is at the L level. In this case, the output of the inverter MI1 is at the L level, and the output of the inverter MI2 is at the H level. Therefore, the p-MOS transistor QP1 and the n-MOS transistor QN2 are turned on, and the n-MOS transistor QN1 and the p-MOS transistor QP2 are turned off, so that the bit lines BL and /BL of the bit line pair are at an H level and an L level, respectively. Similarly, in the case where the column selection signal CA and the write amplifier control signal WAE are both at the H level and the write data IN is at the L level, the bit lines BL and /BL of the bit line pair are at the L level and the H level, respectively.

On the other hand, if either the column selection signal CA or the write amplifier control signal WAE is at the L level, the outputs of the 3-input NAND circuits MN1 and MN2 are at the H level, irrespective of the write data IN. As a result, the outputs of the inverters MI1 and MI2 are both at the L level, so that the p-MOS transistors QP1 and QP2 and the n-MOS transistors QN1 and QN2 are all turned off. As a result, the write amplifier 3 takes an inactive state, and the bit line pair {BL and /BL} takes a high-impedance state.

As described above, the write amplifier control circuit 4 includes the 2-input AND circuit MA1 and the delay circuit 5. In general, the delay circuit 5 is composed of an odd number of inverters connected in multiple stages. The delay circuit 5 outputs an inverted signal of the write enable signal WEN, with the output signal being delayed from its input by a total of the delay times of the inverters.

As shown in FIG. 8, the write amplifier control signal WAE is a logic AND of the write enable signal WEN and the output of the delay circuit 5. While the write enable signal WEN is at an L level, the output of the delay circuit 5 is at an H level, so that the write amplifier control signal WAE is at the L level. If the write enable signal WEN shifts to an H level in this state, the write amplifier control signal WAE takes the H level for the duration of a period equal to the length of the delay time in the delay circuit 5 (hereinafter referred to as the "write time"). Once the write time has elapsed after the write enable signal WEN shifts to the H level, the output of the delay circuit 5 shifts from the H level to the L level, so that the write amplifier control signal WAE also shifts from the H level to the L level. Thus, the write amplifier control circuit 4 outputs a write amplifier control signal WAE which takes the H level only for the duration of a predetermined period (i.e., the write time) in response to the shifting of the write enable signal WEN from the L level to the H level.

Hereinafter, the operation of the conventional semiconductor memory device having the above structure will be described. When all word lines are at the L level, all memory cells 1 are in a high-impedance state (i.e., a state where data input/output is not performed). At this time, the write enable signal WEN and the write amplifier control signal WAE are both at the L level, and the write amplifiers 3 take an inactive state. Moreover, the bit line precharge control signal PCG is at the L level, and the bit line precharge circuits 2 take an active state. Therefore, all bit line pairs are precharged to the H level by the bit line precharge circuits 2.

In order to write data to a given memory cell 1 in this state, there is performed a process of shifting the bit line precharge control signal PCG, the write enable signal WEN, a selected one of all word lines and a selected one of all column selection signals to the H level with a predetermined timing. If the bit line precharge control signal PCG shifts to the H level, the bit line precharge circuits 2 take an inactive state (high-impedance state). If the write enable signal WEN shifts to the H level, the write amplifier control signal WAE takes the H level only for the duration of the write time.

For example, if the word line WL1 and the column selection signal CA1 are selected, the memory cells 1 which are connected to the word line WL1 take an active state while the word line is at the H level, and the write amplifier 3 which is connected to the bit line pair {BL1 and /BL1} takes an active state only for the duration of the write time. As a result, data which is based on the write data IN1 is output to the bit line pair {BL1 and /BL1}. At this time, in the memory cell 1 which is connected to the word line WL1 and the bit line pair {BL1 and /BL1}, the access transistors Q1 and Q2 are turned on. Therefore, via the bit line pair {BL1 and /BL1} which is connected to the access transistors Q1 and Q2, a data write is performed for the latch circuit composed of the drive transistors Q3 and Q4 and the load transistors Q5 and Q6 in the memory cell 1.

Upon a lapse of the write time after shifting to the H level, the write amplifier control signal WAE shifts to the L level. As a result, the write amplifier 3 takes an inactive state. Since the selected word line shifts to the L level due to the shifting of the write amplifier control signal WAE, the selected memory cell 1 takes a high-impedance state. Thereafter, when the bit line precharge control signal PCG shifts to the L level, the bit line precharge circuits 2 take an active state. Thus, all bit line pairs are precharged to the H level by the bit line precharge circuits 2. The above process is to be performed when performing a data write to any memory cell 1.

A data write process in a commonly-used semiconductor memory device was described above. As a separate technique related to semiconductor memory devices, a method of adding dummy memory cells (also known as replica circuits) other than regular memory cells is known. Japanese Laid-Open Patent Publication No. 2002-367377 describes, with respect to a commonly-used semiconductor memory device, adding dummy memory cells, dummy word lines other than regular word lines, and dummy bit line pairs other than regular bit line pairs, and further adding dummy memory cells (as loads) corresponding to the dummy word lines and the dummy bit line pairs. In a semiconductor memory device having such a structure, the dummy word lines are driven concurrently when the regular word lines are driven, and the dummy memory cells perform the same operation as that of the regular memory cells. In such a semiconductor memory device, a signal for causing sense amplifier activation is generated based on a change in the voltage of the dummy bit line pair which is connected to a dummy memory cell.

Among techniques related to semiconductor memory devices incorporating dummy memory cells, many concern a read operation, and in particular generation of sense amplifier activation timing and optimization thereof. A technique concerning a write operation of a semiconductor memory device incorporating dummy memory cells is disclosed in Japanese Laid-Open Patent Publication No. 11-96768. This publication discloses, in a semiconductor memory device incorporating dummy memory cells, performing a data write for a dummy memory cell, and generating a timing signal based on a signal which is generated based on the write operation. However, the dummy memory cells which are described in this publication are not to be employed in conjunction with dummy word lines or dummy bit line pairs.

The conventional semiconductor memory devices have the following problems. In a semiconductor memory device, a write time (i.e., a period during which the write amplifier control signal WAE takes the H level) needs to be sufficiently long so as to ensure that a data write can be completed in all memory cells 1. As described above, the write time is determined by the delay time of the delay circuit 5 in the write amplifier control circuit 4. Therefore, in order to take into account the supply voltage dependency, temperature dependency, and process fluctuations associated with the semiconductor memory device, a large margin must be introduced in the designing of the delay circuit 5.

By prescribing a sufficiently long write time, it becomes possible to stably perform a data write to the memory cells. However, if an excessively long write time is prescribed, access to the semiconductor memory device will be slowed.

In addition, as the write time increases, charge/discharge currents for the bit line pair of the memory cell which is connected to the selected word line increase, thus resulting in an increase in the power consumption of the semiconductor memory device.

In the case of a so-called compilable memory in which the number of word lines and the number of bit lines can be configured in a variable manner, the timing design for the delay circuit 5 may be adapted to the largest possible configuration. However, adapting the timing design for the delay circuit 5 to the maximum configuration has a problem in that, when the compilable memory has a minimum configuration, the same write time as that for the maximum configuration is used. Thus, in the case of a compilable memory, the problems associated with increased access time and increased power consumption become particularly outstanding. Note that providing delay circuits 5 having different delay times for all possible configurations might theoretically be possible, but would not be practical.

SUMMARY OF THE INVENTION

Therefore, an object of the present invention is to provide a low-power-consumption semiconductor memory device which can ensure an optimum write timing regardless of its configuration.

The present invention has the following features to attain the object mentioned above.

A semiconductor memory device including dummy memory cells according to the present invention comprises word lines, bit line pairs, memory cells, bit line precharge circuits, and at least one write amplifier, and further comprises a dummy word line, a dummy bit line pair, first to third dummy memory cells, and a write completion detection circuit. Each memory cell is disposed at an intersection between one of the plurality of word lines and one of the plurality of bit line pairs. The first dummy memory cell is disposed at an intersection between the dummy word line and the dummy bit line pair. Each second dummy memory cell is disposed at an intersection between the dummy word line and one of the plurality of bit line pairs. Each third dummy memory cell is disposed at an intersection between one of the plurality of word lines and the dummy bit line pair. Each bit line precharge circuit controls a precharge state of the dummy bit line pair or one of the plurality of bit line pairs. The at least one write amplifier drives the dummy bit line pair and one of the plurality of bit line pairs to write data in a selected memory cell and the first dummy cell. The write completion detection circuit generates a write completion signal based on a change in a state of a storing node included in the first dummy memory cell.

The above semiconductor memory device includes a first dummy memory cell, to which data can be written with a substantially identical timing to the write timing for the regular memory cells, and generates a write completion signal based on a change in the state of the storing node included in the first dummy memory cell. As a result, an optimum write timing which ensures that a data write has been performed for all relevant memory cells can be obtained regardless of the configuration of the semiconductor memory device. Since the write timing is optimized, unnecessary charge/discharge currents from the memory cells to the bit line pairs are reduced, whereby the power consumption during a write operation is reduced.

In this case, the state of the storing node included in the first dummy memory cell may be initialized to a predetermined state when the dummy word line is driven.

The dummy word line may be driven only when one of the plurality of word lines is selected during a write operation, the dummy word line being driven in synchronization with the selected word line. Thus, the dummy word line is not driven during a read operation. As a result, the power consumption can be further reduced due to the elimination of the charge/discharge current on the dummy word line during a read operation.

The write completion detection circuit may generate the write completion signal based on a change in a logic value on the storing node included in the first dummy memory cell.

More preferably, the write completion detection circuit may include an inverter circuit for receiving the logic value on the storing node included in the first dummy memory cell and outputting the write completion signal.

Alternatively, the write completion detection circuit may include: a first transistor having a source terminal which is connected to a power terminal and a gate terminal which is controlled based on the dummy word line; a second transistor having a source terminal which is connected to a drain terminal of the first transistor, and a gate terminal which is connected to the storing node included in the first dummy memory cell; and a third transistor having a source terminal which is grounded, a drain terminal which is connected to a drain terminal of the second transistor, and a gate terminal which is controlled based on the dummy word line, and the write completion detection circuit may output, as the write completion signal, a state of the common drain terminal of the second and third transistors. Thus, in a transitional period during which the state of the memory cell storing node included in the dummy memory cell changes, it becomes possible to prevent a shoot-through current from flowing from the power terminal to ground in the write completion detection circuit.

Particularly in the above case, a supply voltage may be applied to the source terminal of the first transistor, the supply voltage being higher than a supply voltage which is supplied to the plurality of memory cells, the first to third dummy memory cells, and the plurality of bit line precharge circuits. Thus, in the case where two levels of supply voltage are respectively applied to the memory cell array and the peripheral circuitry, such that the supply voltage for the memory cell array is lower than that for the peripheral circuitry, the semiconductor memory device can operate in a similar manner to the case where only one level of supply voltage is supplied, thus facilitating the level shifting between the two levels of voltage.

The third dummy memory cell may fixedly store inverted data of write data for the first dummy memory cell. Thus, a more reliable write timing can be obtained.

The semiconductor memory device may comprise a plurality of first dummy memory cells, and the write completion detection circuit may shift the write completion signal to a value indicating write completion when a latest change among any changes in the states of the memory cell storing nodes included in the plurality of first dummy memory cells occurs. Thus, a more reliable write timing can be obtained.

The at least one write amplifier may drive the bit line pair only while the write completion signal takes a value indicating incompletion of write during a write operation. Thus, the period of time in which each write amplifier takes an active state is reduced, so that the power consumption during a write operation is reduced.

The semiconductor memory device may be a compilable memory in which a number of word lines and a number of bit lines can be configured in a variable manner. In a compilable memory, the number of dummy memory cells is increased or decreased in accordance with an increase or decrease in the number of memory cells; the loads on the word lines and the loads on the dummy word lines are similarly increased or decreased; and the loads on the it line pairs and the load on the dummy bit line pairs are also similarly increased or decreased. Thus, the write timing for the memory cells and the write timing for the dummy memory cells are always maintained substantially identical, and therefore an optimum write timing can be obtained regardless of the configuration of the semiconductor memory device.

These and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
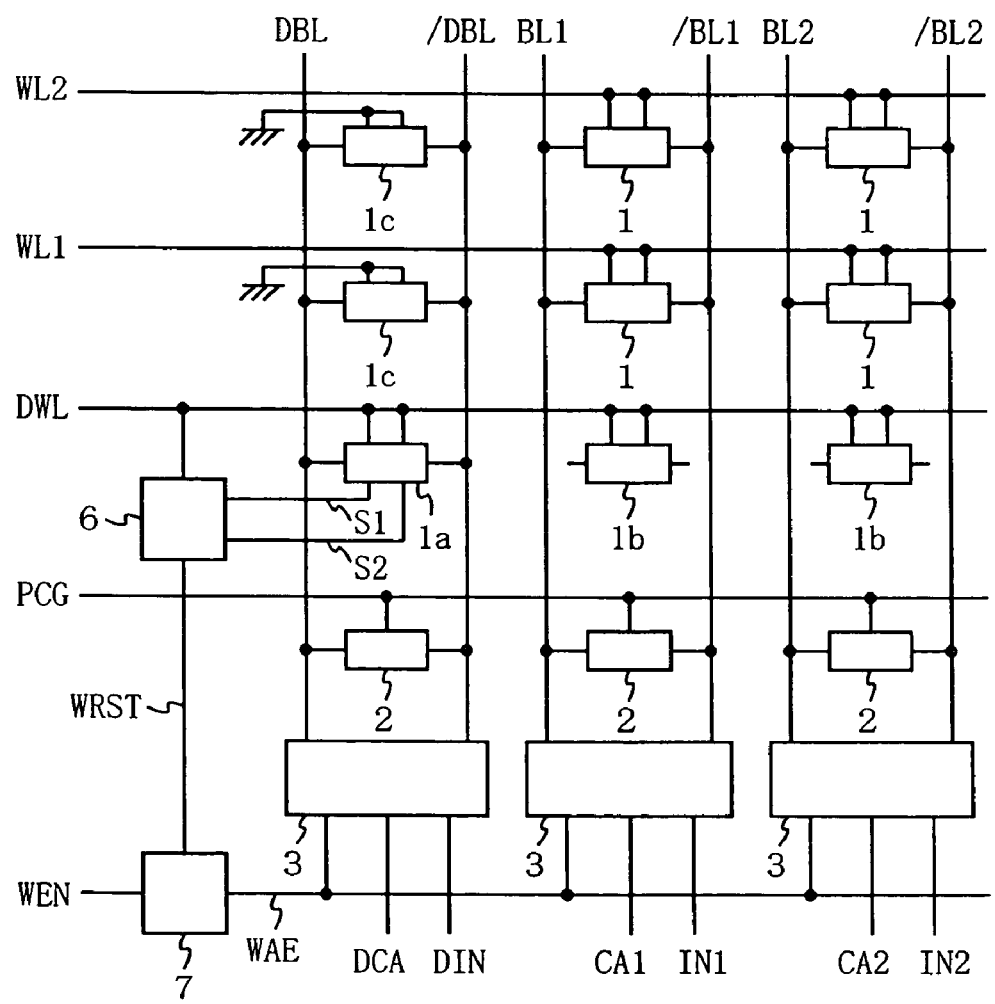
FIG. 1 is a structural diagram showing a semiconductor memory device according to a first embodiment of the present invention.

FIG. 1 is a structural diagram showing a semiconductor memory device according to a first embodiment of the present invention. The semiconductor memory device shown in FIG. 1 comprises memory cells 1, dummy memory cells 1a, 1b, and 1c, bit line precharge circuits 2, write amplifiers 3, a memory cell storing node detection circuit 6, and a write amplifier control circuit 7. In FIG. 1 are shown: word lines WL1 and WL2; a dummy word line DWL; a bit line pair BL1 and /BL1 and a bit line pair BL2 and /BL2; a dummy bit line pair DBL and /DBL; a bit line precharge control signal PCG; a write enable signal WEN; a write amplifier control signal WAE; column selection signals DCA and CA1 and CA2; write data DIN and IN1 and IN2; a write completion signal WRST; and memory cell storing nodes S1 and S2, which are included in the dummy memory cell 1a.

The memory cells 1 and the dummy memory cells 1a to 1c are arranged in a two-dimensional array. In the semiconductor memory device shown in FIG. 1, four memory cells 1 are provided, one at each of the four intersections between the word lines WL1 and WL2 and the bit line pairs {BL1 and /BL1} and {BL2 and /BL2}. The dummy memory cell 1a (of which there is only one) is provided at the intersection between the dummy word line DWL and the dummy bit line pair {DBL and /DBL}. Two dummy memory cells 1b are provided, one at each of the two intersections between the dummy word line DWL and the bit line pairs {BL1 and /BL1} and {BL2 and /BL2}. Two dummy memory cells 1c are provided, one at each of the two intersections between the word lines WL1 and WL2 and the dummy bit line pair {DBL and /DBL}.

Figure 10:
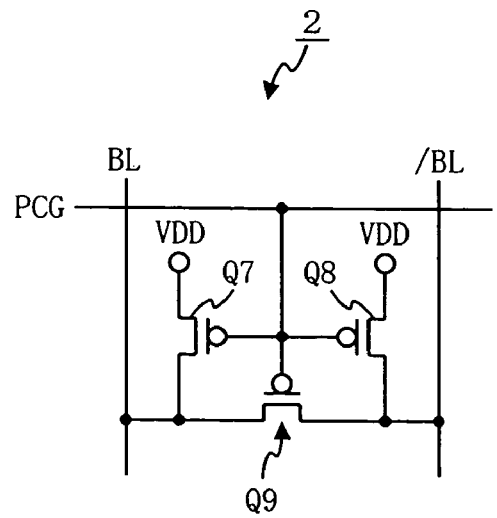
FIG. 10 is a circuit diagram showing a detailed structure of a bit line precharge circuit.
Figure 11:
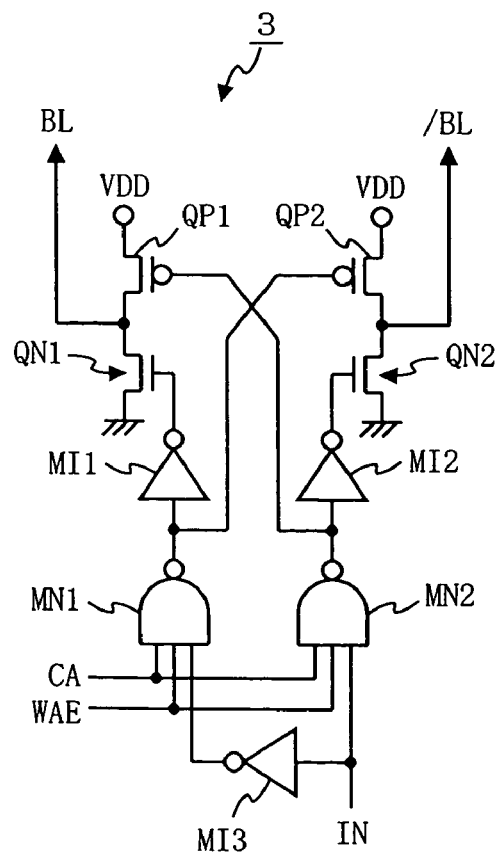
FIG. 11 is a circuit diagram showing a detailed structure of a write amplifier.

As the memory cells 1, the bit line precharge circuits 2, and the write amplifiers 3 in the present embodiment, the same circuits as those used in the conventional semiconductor memory device are employed. Since the details of these circuits have already been described with reference to FIGS. 9 to 11, the descriptions thereof are omitted.

The dummy memory cell 1a is provided in order to generate the write completion signal WRST. The dummy memory cells 1b are provided in order to ensure that the load on the dummy word line DWL is equal to the load on either one of the regular word lines WL1 and WL2. The "load" as used herein includes, among others, wiring resistance and wiring capacitance components associated with a word line or a dummy word line, and a capacitance component associated with any transistor which is connected to the word line or the dummy word line. The dummy memory cells 1c are provided in order to ensure that the load on the dummy bit line pair {DBL and /DBL} is equal to the load on either regular bit line pair {BL1 and /BL1} or {BL2 and /BL2}. The "load" as used here in includes, among others, wiring resistance and wiring capacitance components associated with a bit line pair or a dummy bit line pair, and a capacitance component associated with any transistor which is connected to the bit line pair or the dummy bit line pair.

Figure 9:
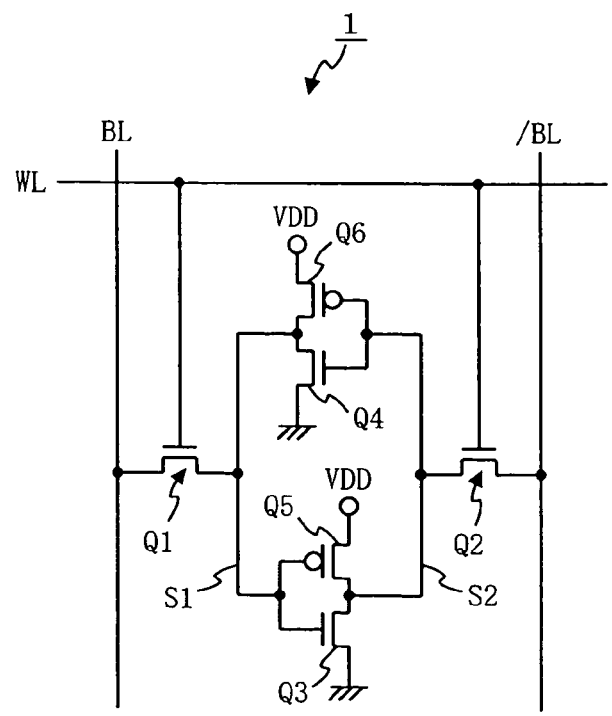
FIG. 9 is a circuit diagram showing a detailed structure of a memory cell.

Each of the dummy memory cells 1a to 1c has the same structure as that of the memory cell 1 as shown in FIG. 9. However, as shown in FIG. 1, the dummy memory cells 1a to 1c are connected differently from the memory cells 1. That is, the memory cell storing nodes S1 and S2 included in the dummy memory cell 1a are connected to the respective terminals of the memory cell storing node detection circuit 6. The dummy memory cells 1b are connected to neither bit line pair. The word line input terminal of each dummy memory cell 1c is grounded.

Figure 2:
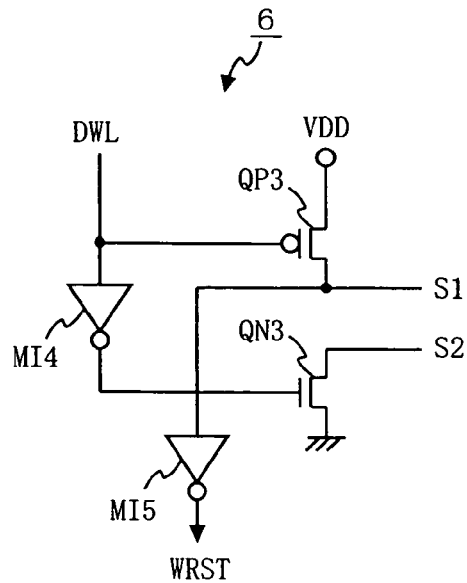
FIG. 2 is a circuit diagram showing a detailed structure of a memory cell storing node detection circuit used in a semiconductor memory device according to the first embodiment of the present invention.

In the present embodiment, the memory cell storing node detection circuit 6 functions as a write completion detection circuit. FIG. 2 is a circuit diagram showing a detailed structure of the memory cell storing node detection circuit 6. The memory cell storing node detection circuit 6 shown in FIG. 2 includes a p-MOS transistor QP3, an n-MOS transistor QN3, and inverters MI4 and MI5. In FIG. 2 are shown: the dummy word line DWL; the write completion signal WRST; the memory cell storing nodes S1 and S2, which are included in the dummy memory cell 1a; and a power terminal VDD.

Connections of the p-MOS transistor QP3 are as follows: a gate terminal is connected to the dummy word line DWL; a source terminal is connected to the power terminal VDD; and a drain terminal is connected to the memory cell storing node S1 of the dummy memory cell 1a. Connections of the n-MOS transistor QN3 are as follows: a gate terminal is connected to an output terminal of the inverter MI4 whose input terminal is connected to the dummy word line DWL; a drain terminal is connected to the memory cell storing node S2 of the dummy memory cell 1a; and a source terminal is grounded. The inverter MI5 inverts the state of the memory cell storing node S1 of the dummy memory cell 1a, and outputs the resultant signal as the write completion signal WRST.

While the dummy word line DWL is at an L level, the p-MOS transistor QP3 is turned on, so that the memory cell storing node S1 of the dummy memory cell 1a takes an H level, and the write completion signal WRST takes an L level. Since the output of the inverter MI4 is at an H level, the n-MOS transistor QN3 is turned on, so that the memory cell storing node S2 of the dummy memory cell 1a takes an L level.

When the dummy word line DWL shifts to the H level, the p-MOS transistor QP3 and the n-MOS transistor QN3 are both turned off. Consequently, the write completion signal WRST has an inverted state of the memory cell storing node S1 of the dummy memory cell 1a. The write completion signal WRST which is thus obtained may be used for, for example, the timing control of the write amplifiers 3, as described below. Moreover, the write completion signal WRST may be output to the outside of the semiconductor memory device, so as to be used for the timing control of various circuits such as a semiconductor memory device.

Figure 3:
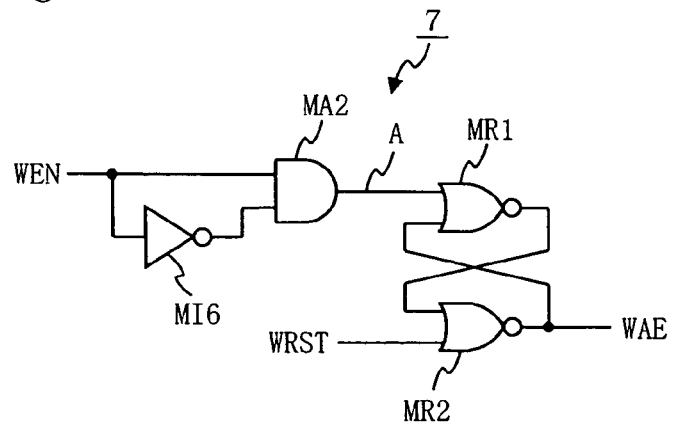
FIG. 3 is a circuit diagram showing a detailed structure of a write amplifier control circuit used in a semiconductor memory device according to the first embodiment of the present invention.

FIG. 3 is a circuit diagram showing a detailed structure of the write amplifier control circuit 7. The write amplifier control circuit 7 shown in FIG. 3 includes 2-input NOR circuits MR1 and MR2, an inverter MI6, and a 2-input AND circuit MA2. In FIG. 3 are shown: the write enable signal WEN; the write amplifier control signal WAE; the write completion signal WRST; and an output signal output signal A from the 2-input AND circuit MA2.

To the respective input terminals of the 2-input AND circuit MA2, the write enable signal WEN and an output terminal of the inverter MI6 whose input terminal is connected to the write enable signal WEN are connected. Therefore, when the write enable signal WEN shifts from an L level to an H level, a narrow H-level pulse occurs on the output signal A from the 2-input AND circuit MA2. The 2-input NOR circuits MR1 and MR2 together compose an RS latch. The output signal A from the 2-input AND circuit MA2 is connected to a set input terminal of the RS latch, and the write completion signal WRST is connected to a reset input terminal of the RS latch. The output from the 2-input NOR circuit MR2 is the write amplifier control signal WAE.

Figure 4:
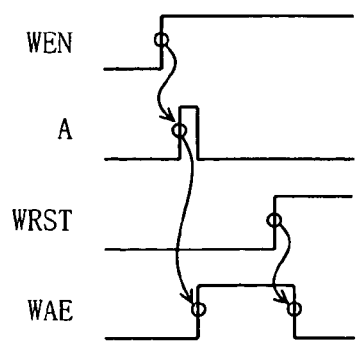
FIG. 4 is a timing diagram for a write amplifier control circuit used in a semiconductor memory device according to the first embodiment of the present invention.

FIG. 4 is a timing diagram for the write amplifier control circuit 7 shown in FIG. 3. In an initial state, i.e., when the word line and the dummy word line are both at the L level, the write enable signal WEN, the write amplifier control signal WAE, and the write completion signal WRST are all at the L level. If the write enable signal WEN shifts from the L level to the H level in this state, a narrow H-level pulse occurs on the output signal A from the 2-input AND circuit MA2. The output signal A, i.e., a set input for the RS latch composed by the 2-input NOR circuits MR1 and MR2, causes the write amplifier control signal WAE (which is one output from the RS latch) to shift to the H level. Thereafter, when the write completion signal WRST (which is fed to the RS latch as a reset input) shifts to the H level, the write amplifier control signal WAE shifts to the L level.

In the write amplifier 3 which is connected to the dummy bit line pair {DBL and /DBL}, the column selection signal DCA is fixed at an H level, and the write data DIN is fixed at an L level. Therefore, the write amplifier 3 is controlled only by the write amplifier control signal WAE, so as to take an inactive state while the write amplifier control signal WAE is at the L level, or an active state while the write amplifier control signal WAE is at the H level. While the write amplifier control signal WAE is at the H level, the dummy bit line DBL of the dummy bit line pair is always at the L level, and the dummy bit line /DBL is always at the H level.

Hereinafter, an operation of the semiconductor memory device according to the present embodiment having the above structure will be described. As shown in FIG. 1, the dummy memory cells 1b are not connected to the bit line pair, and the word line input terminal of each dummy memory cell 1c is grounded. Therefore, the dummy memory cells 1b and 1c affect neither the bit line pairs nor the dummy bit line pair.

In an initial state, the word lines WL1 and WL2, the dummy word line DWL, the bit line precharge control signal PCG, and the write enable signal WEN are all controlled so as to take the L level. In this state, all memory cells I and the dummy memory cell 1a are in a high-impedance state (i.e., a state where data input/output is not performed). Since the dummy word line DWL is at the L level, due to the action of the memory cell storing node detection circuit 6, the memory cell storing node S1 of the dummy memory cell 1a is initialized to the H level, the memory cell storing node S2 is initialized to the L level, and the write completion signal WRST takes the L level. Since the write enable signal WEN is at the L level, the write amplifier control signal WAE is at the L level, and the write amplifiers 3 are in an inactive state. Since the bit line precharge control signal PCG is at the L level, the bit line precharge circuits 2 are in an active state, and all bit line pairs {BL1 and /BL1} and {BL2 and /BL2} and the dummy bit line pair {DBL and /DBL} are precharged to the H level by the bit line precharge circuits 2.

In order to write data to a given memory cell 1 in this state, as in the case of a conventional semiconductor memory device, a process is performed to shift each of the bit line precharge control signal PCG, the write enable signal WEN, a word line selected from among all word lines, and one column selection signal selected from all column selection signals to the H level with a predetermined timing. If the bit line precharge control signal PCG shifts to the H level, the bit line precharge circuit 2 takes an inactive state (high-impedance state). If the write enable signal WEN shifts to the H level, the write amplifier control signal WAE takes the H level only for the duration of a write time, as in the case of the conventional semiconductor memory device.

For example, if the word line WL1 and the column selection signal CA1 are selected, the memory cells 1 which are connected to the word line WL1 take an active state while the word line is at the H level, and the write amplifier 3 which is connected to the bit line pair {BL1 and /BL1} takes an active state only for the duration of the write time. As a result, data which is based on the write data IN1 is output to the bit line pair {BL1 and /BL1}. At this time, in the memory cell 1 which is connected to the word line WL1 and the bit line pair {BL1 and /BL1}, the access transistors Q1 and Q2 are turned on. Therefore, via the bit line pair {BL1 and /BL1} connected to the access transistors Q1 and Q2, a data write is performed for the latch circuit composed of the drive transistors Q3 and Q4 and the load transistors Q5 and Q6.

When either word line WL1 or WL2 is selected, the dummy word line DWL is driven in synchronization with the selected word line. For example, when either word line WL1 or WL2 shifts from the L level to the H level, the dummy word line DWL concurrently shifts from the L level to the H level. If the write enable signal WEN shifts from the L level to the H level, the write amplifier control signal WAE shifts to the H level, and the write amplifier 3 which is connected to the dummy bit line pair {DBL and /DBL} takes an active state. Since the write data DIN which is input to this write amplifier 3 is fixed at the L level, while the write amplifier 3 is in an active state, the dummy bit lines DBL and /DBL of the dummy bit line pair take the L level and the H level, respectively. Thus, a data write is performed for the dummy memory cell 1a in a similar manner to the memory cell 1, except that the L level and the H level are always written to the memory cell storing nodes S1 and S2, respectively, of the dummy memory cell 1a.

As described above, it is ensured that the load on the dummy word line DWL is equal to the load on either word line WL1 or WL2, and that the load on the dummy bit line pair {DBL and /DBL} is equal to the load on either bit line pair {BL1 and /BL1} or {BL2 and /BL2}. Therefore, the write completion timing for the memory cell 1 substantially coincides with the write completion timing for the dummy memory cell 1a; this is also true in the case where a data write is performed for any other memory cell 1.

At substantially the same time as the data write to the memory cell 1 is completed, the memory cell storing node S1 of the dummy memory cell 1a shifts from the H level to the L level, as a result of which the write completion signal WRST shifts from the L level to the H level (refer to the description of FIG. 2). Accordingly, the write amplifier control signal WAE shifts from the H level to the L level (refer to the description of FIG. 3).

If the write amplifier control signal WAE shifts to the L level, the write amplifier 3 takes an inactive state. Thereafter, in synchronization with the write amplifier control signal WAE, or after the lapse of a predetermined period, the selected word line and the dummy word line DWL are controlled so as to shift to the L level. As a result, the selected memory cell 1 and the dummy memory cell 1a take a high-impedance state. Once the dummy word line DWL shifts to the L level, the memory cell storing nodes S1 and S2 of the dummy memory cell 1a are again initialized to the H level and the L level, respectively, and the write completion signal WRST shifts from the H level to the L level. If the bit line precharge control signal PCG shifts to the L level, the bit line precharge circuits 2 take an active state, and all bit line pairs {BL1 and /BL1} and {BL2 and /BL2} and the dummy bit line pair {DBL and /DBL} are precharged to the H level. The above-described process is to be performed regardless of which memory cell 1 a data write is performed for.

As described above, the semiconductor memory device according to the present embodiment comprises a dummy memory cell to which data can be written at substantially the same time as a regular memory cell, and generates a write completion signal based on changes in the states of the storing nodes which are included in the dummy memory cell. Therefore, an optimum write timing which ensures that a data write has been performed for all relevant memory cells can be obtained regardless of the configuration of the semiconductor memory device. Since the write timing is optimized, the unnecessary charge/discharge currents from the memory cells to the bit line pairs are reduced, whereby the power consumption during a write operation is reduced.

In particular, in the case where it is ensured that the dummy word line is driven only when any of the word lines is selected during a write operation, the dummy word line will not be driven during a read operation. As a result, the power consumption can be further reduced due to the elimination of the charge/discharge current on the dummy word line during a read operation.

Alternatively, in the case where it is ensured that each write amplifier will drive a bit line pair or the dummy bit line pair only while the write completion signal is at the L level during a write operation, the period of time in which the write amplifier takes an active state is reduced, so that the power consumption during a write operation is reduced.

(Second Embodiment)

Figure 5:
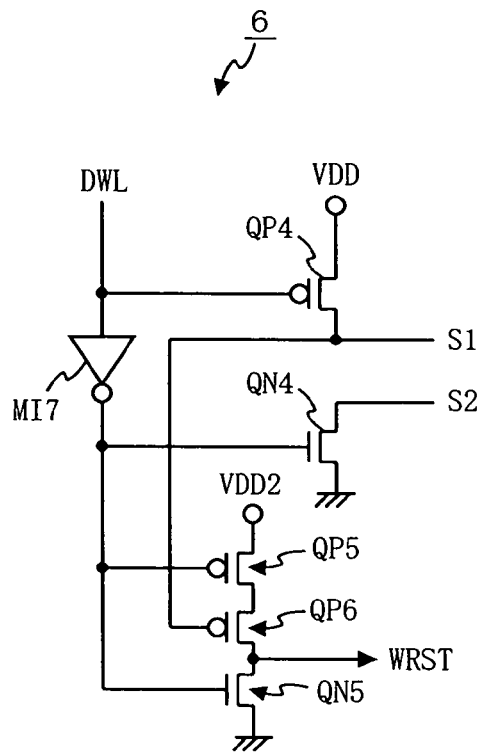
FIG. 5 is a circuit diagram showing a detailed structure of a memory cell storing node detection circuit used in a semiconductor memory device according to a second embodiment of the present invention.

The semiconductor memory device according to a second embodiment of the present invention is identical to the semiconductor memory device of the first embodiment except that the memory cell storing node detection circuit 6 is replaced by a circuit shown in FIG. 5. FIG. 5 is a circuit diagram showing a detailed structure of the memory cell storing node detection circuit 6 used in the semiconductor memory device according to the present embodiment. The memory cell storing node detection circuit 6 shown in FIG. 5 includes p-MOS transistors QP4 to QP6, n-MOS transistors QN4 and QN5, and an inverter MI7. In FIG. 5 are shown: a dummy word line DWL; a write completion signal WRST; memory cell storing nodes S1 and S2 which are included in the dummy memory cell 1a; and power terminals VDD and VDD2.

Connections of the p-MOS transistor QP4 are as follows: a gate terminal is connected to the dummy word line DWL; a source terminal is connected to the power terminal VDD; and a drain terminal is connected to the memory cell storing node S1 of the dummy memory cell 1a. Connections of the n-MOS transistor QN4 are as follows: a gate terminal is connected to an output terminal of the inverter MI7, whose input terminal is connected to the dummy word line DWL; a drain terminal is connected to the memory cell storing node S2 of the dummy memory cell 1a; and a source terminal is grounded. Connections of the p-MOS transistor QP5 are as follows: a source terminal is connected to the power terminal VDD2; and a gate terminal is connected to the output terminal of the inverter MI7. Connections of the p-MOS transistor QP6 are as follows: a source terminal is connected to a drain terminal of the p-MOS transistor QP5; and a gate terminal is connected to the memory cell storing node S1 of the dummy memory cell 1a. Connections of the n-MOS transistor QN5 are as follows: a source terminal is grounded; a drain terminal is connected to the drain terminal of the p-MOS transistor QP6; and a gate terminal is connected to the output terminal of the inverter MI7. The state of the common drain terminal of the p-MOS transistor QP6 and n-MOS transistor QN5 is output as the write completion signal WRST.

Hereinafter, operations of the semiconductor memory device according to the present embodiment having the above structure will be described. First, an operation to be performed in the case where the same level of supply voltage is applied to the power terminals VDD and VDD2 will be described. While the dummy word line DWL is at the L level, the p-MOS transistor QP4 is turned on, so that the memory cell storing node S1 of the dummy memory cell 1a takes the H level. Since the output from the inverter MI7 is at the H level, the n-MOS transistor QN4 is turned on, and the memory cell storing node S2 of the dummy memory cell 1a takes the L level. Furthermore, the p-MOS transistors QP5 and QP6 are both turned off, and the n-MOS transistor QN5 is turned on. As a result, the write completion signal WRST takes the L level.

When the dummy word line DWL shifts to the H level, the p-MOS transistor QP4 and the n-MOS transistor QN4 are both turned off. Since the output from the inverter MI7 is at the L level, the p-MOS transistor QP5 is turned on, and the n-MOS transistor QN5 is turned of f. Therefore, the write completion signal WRST changes depending on whether the p-MOS transistor QP6 is turned on or not. Since the gate terminal of the p-MOS transistor QP6 is connected to the memory cell storing node S1 of the dummy memory cell 1a, after all, the write completion signal WRST has an inverted state of the memory cell storing node S1 of the dummy memory cell 1a. When the data write for the dummy memory cell 1a is completed, the memory cell storing node S1 shifts from the H level to the L level. Consequently, the p-MOS transistor QP6 is turned on, and the write completion signal WRST shifts from the L level to the H level.

Thus, the memory cell storing node detection circuit of the present embodiment (FIG. 5) operates in substantially the same manner as the memory cell storing node detection circuit of the first embodiment (FIG. 2). However,in the memory cell storing node detection circuit of the present embodiment, the p-MOS transistor QP6 is turned off for a period existing after the dummy word line DWL shifts to the H level and until the memory cell storing node S1 of the dummy memory cell 1a shifts to the L level. Therefore, during this period, the write completion signal WRST takes a high-impedance state. Since an actual semiconductor memory device will have capacitance (capacitance components associated with wiring and transistors), the write completion signal WRST will retain the L level for a little while after it enters a high-impedance state. Therefore, at the logic level, the memory cell storing node detection circuit of the present embodiment and the memory cell storing node detection circuit of the first embodiment perform the same operation. Thus, the semiconductor memory device of the present embodiment provides the same effects as those provided by the semiconductor memory device of the first embodiment.

In addition, in the memory cell storing node detection circuit of the present embodiment, the output timing of the write completion signal WRST is controlled based on the dummy word line DWL. As a result, in a transitional period during which the memory cell storing node S1 of the dummy memory cell 1a shifts from the H level to the L level, it becomes possible to prevent a shoot-through current from flowing from the power terminal VDD2 to ground via the p-MOS transistors QP5 and QP6 and the n-MOS transistor QN5. In general, a data transition time in a memory cell (which is equal to a transition time during which the state of the memory cell storing nodes S1 and S2 changes) becomes longer as the supply voltage decreases. Therefore, the effect of preventing shoot-through current obtained by using the memory cell storing node detection circuit shown in FIG. 5 becomes particularly outstanding in a semiconductor memory device whose supply voltage is low.

Next, an operation to be performed in the case where different levels of supply voltage are applied to the power terminals VDD and VDD2 will be described. A technique is conceivable which provides different levels of supply voltage for the memory cell array portion and the peripheral circuitry portion of a semiconductor memory device. By using such a technique to provide a lower level supply voltage for the memory cell array portion and a higher level voltage for the peripheral circuitry portion, the power consumption in the memory cell array portion can be reduced while maintaining a high operation speed for the peripheral circuitry, so that a semiconductor memory device which operates at a high speed but consumes relatively little power can be provided. In this case, the level shifting between the two supply voltages can be facilitated by employing the memory cell storing node detection circuit of the present embodiment (FIG. 5), as described below.

In the present embodiment, a supply voltage V1 is applied to the memory cells 1, the dummy memory cells 1a to 1c, and the bit line precharge circuits 2, and a supply voltage V2 which is higher than the supply voltage V1 is applied to any other circuitry. It is assumed that all circuits share a common ground. In this case, in the memory cell storing node detection circuit 6 shown in FIG. 5, the supply voltage V2 is supplied to the inverter MI7. The supply voltage V2 is also applied to the source terminal of the p-MOS transistor QP5, which is connected to the power terminal VDD2.

The dummy word line DWL is driven by the supply voltage V2 for the peripheral circuitry. While the dummy word line DWL is at the L level, the p-MOS transistor QP4 whose gate terminal is connected to the dummy word line DWL is turned on, so that the memory cell storing node S1 of the dummy memory cell 1a takes the H level (voltage level V1). At this time, the gate terminal of the p-MOS transistor QP6, although being at the H level, only has the voltage level V1, and therefore the p-MOS transistor QP6 is not completely turned off. On the other hand, since the supply voltage V2 is supplied to the inverter MI7 and the output from the inverter MI7 is at the H level (voltage level V2), the p-MOS transistor QP5 is surely turned off. Thus, even though the p-MOS transistor QP6 may not be completely turned off, the p-MOS transistor QP5 (which is in serial connection to the p-MOS transistor QP6) is surely turned off to prevent a shoot-through current from flowing from the power terminal VDD2 to ground. Moreover, since the n-MOS transistor QN4 is turned on, the memory cell storing node S2 of the dummy memory cell 1a is at the L level. Since the n-MOS transistor QN5 is also turned on, the write completion signal WRST is at the L level.

If the dummy word line DWL shifts to the H level (voltage level V2), the p-MOS transistor QP4 and the n-MOS transistor QN4 are both turned off. At this time, the output from the inverter MI7 is at the L level, so that the p-MOS transistor QP5 is turned on, and the n-MOS transistor QN5 is turned off. Therefore, the write completion signal WRST changes depending on whether the p-MOS transistor QP6 is turned on or not. Since the gate terminal of the p-MOS transistor QP6 is connected to the memory cell storing node S1 of the dummy memory cell 1a, after all, the write completion signal WRST has an inverted state of the memory cell storing node S1 of the dummy memory cell 1a.

However, during a period existing after the dummy word line DWL shifts to the H level and until the data write to the dummy memory cell 1a is begun, the memory cell storing node S1 of the dummy memory cell 1a is at the voltage level V1, so that the p-MOS transistor QP6 is not completely turned off. Therefore, the write completion signal WRST may possibly have a gradual increase from the L level. However, in semiconductor memory devices in general, the period of time which exists after a word line and the dummy word line are driven and until data is written to a memory cell and the dummy memory cell is no more than several nanoseconds. Furthermore, since the p-MOS transistor QP6 is not completely turned off, only a minute current flows through the p-MOS transistor QP6, and thus the amount of charge which flows into the write completion signal line WRST is very small. Therefore, the influence on any subsequent circuit which is connected to the write completion signal line WRST is negligible.

Since the source terminal of the p-MOS transistor QP5 is at the H level (voltage level V2), the write completion signal WRST is at the H level (voltage level V2). Thus, the memory cell storing node detection circuit of the present embodiment (FIG. 5) outputs a write completion signal WRST whose H level is equal to the voltage level V2, based on a signal whose H level is equal to the voltage level V1. In this manner, by employing the memory cell storing node detection circuit of the present embodiment (FIG. 5), level shifting between the two supply voltages can be facilitated.

As described above, by applying the higher supply voltage V2 to the source terminal of the p-MOS transistor QP5, it can be ensured that two levels of supply voltage are respectively applied to the memory cell array and the peripheral circuitry. As a result, even though the supply voltage for the memory cell array may be lower than that for the peripheral circuitry, the semiconductor memory device can operate in a similar manner to the case where only one level of supply voltage is supplied, thus facilitating the level shifting between the two levels of voltage.

(Third Embodiment)

Figure 6:
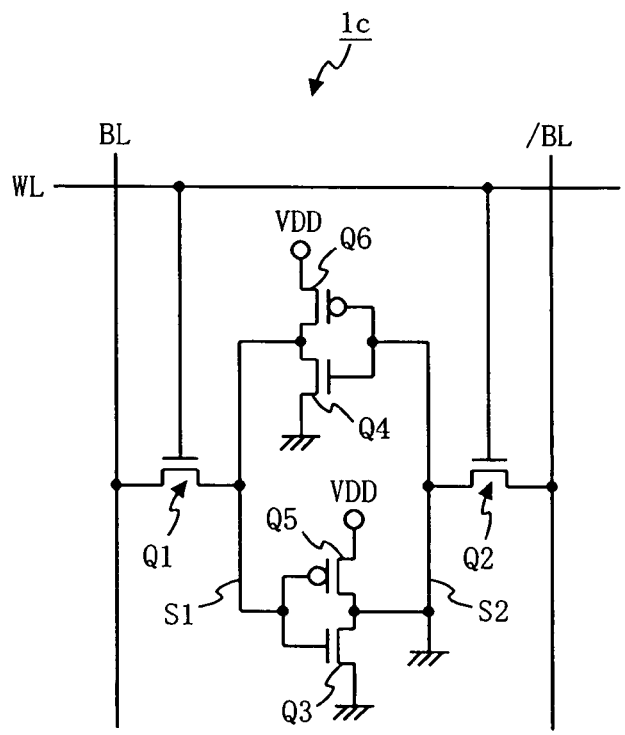
FIG. 6 is a circuit diagram showing a detailed structure of a dummy memory cell used in a semiconductor memory device according to a third embodiment of the present invention.

A semiconductor memory device according to a third embodiment of the present invention is identical to the semiconductor memory device of the first embodiment except that each dummy memory cell 1c is replaced by a circuit shown in FIG. 6. FIG. 6 is a circuit diagram showing a detailed structure of the dummy memory cell 1c used in the semiconductor memory device according to the present embodiment. The dummy memory cell 1c shown in FIG. 6 is identical to the dummy memory cell 1c in the semiconductor memory device of the first embodiment (FIG. 9) except that the memory cell storing node S2 is grounded.

Hereinafter, an operation of the semiconductor memory device according to the present embodiment having the above structure will be described. Since a word line input terminal of each dummy memory cell 1c is grounded as show in FIG. 1, the circuit structure of the dummy memory cell 1c does not affect the logic operation of the overall semiconductor memory device. Therefore, the semiconductor memory device of the present embodiment operates in a substantially identical manner to the semiconductor memory device of the first embodiment.

Due to the miniaturization of semiconductor memory devices in recent years, off-leak currents of transistors are generally increased. Therefore, in the dummy memory cell 1c, even if the access transistors Q1 and Q2 are both turned off due to the word line input terminal being grounded, there is still a minute off-leak current flowing through the access transistors Q1 and Q2. This minute off-leak current affects the dummy bit line pair {DBL and /DBL} via the access transistors Q1 and Q2.

If dummy memory cells 1c having the same structure as that of the memory cells 1 (FIG. 9) are employed as in the case of the first embodiment, after power supply is begun, the memory cell storing nodes S1 and S2 of the dummy memory cell 1c will take different states from one dummy memory cell 1c to another dummy memory cell 1c. In other words, the memory cell storing nodes S1 and S2 may respectively be at the H level and the L level in one dummy memory cell 1c, but the opposite may be the case in another dummy memory cell 1c. If it is ensured that the memory cell storing nodes S1 and S2 in each dummy memory cell 1c respectively take the same states as those in any other dummy memory cell 1c, the influence of the off-leak current flowing through the access transistors Q1 and Q2 on the dummy bit line pair {DBL and /DBL} will become maximum.

As described in the first embodiment, during a write operation to the dummy memory cell 1a, the dummy bit lines DBL and /DBL of the dummy bit line pair being at the L level and the H level, respectively. Therefore, as shown in FIG. 6, the memory cell storing node S2 of each dummy memory cell 1c is grounded, in order to fix the memory cell storing node S1 at the H level and fix the memory cell storing node S2 at the L level. As a result, the state of the dummy bit line pair {DBL and /DBL} which exists when performing a data write to the dummy memory cell 1a (i.e., the dummy bit lines DBL and /DBL of the dummy bit line pair being at the L level and the H level, respectively) and the influence of the off-leak current in the dummy memory cell 1c affecting the dummy bit line pair {DBL and /DBL} (i.e., the dummy bit lines DBL and /DBL of the dummy bit line pair being at the H level and the L level, respectively) act in opposite directions, whereby the amount of time required to perform a write operation to the dummy memory cell 1a is maximized.

Similarly, a write operation for a memory cell 1 takes the maximum time in a situation similar to the above (i.e., the memory cell storing nodes in every memory cell that is connected to the same bit line pair respectively take the same states as those in any other memory cell connected to the bit line pair, and inverted data of the memory cell storing node is to be written to a selected one of the memory cells connected to the same bit line pair).

Therefore, by employing the dummy memory cell 1c shown in FIG. 6, it can be ensured with an improved certainty that a write operation is successfully performed regardless of the states of the memory cell storing nodes in all memory cells 1.

As described above, since each dummy memory cell 1c which is connected to the dummy bit line pair {DBL and /DBL} fixedly stores inverted data of the write data for the dummy memory cell 1a, it becomes possible to obtain a more reliable write timing.

(Fourth Embodiment)

Figure 7:
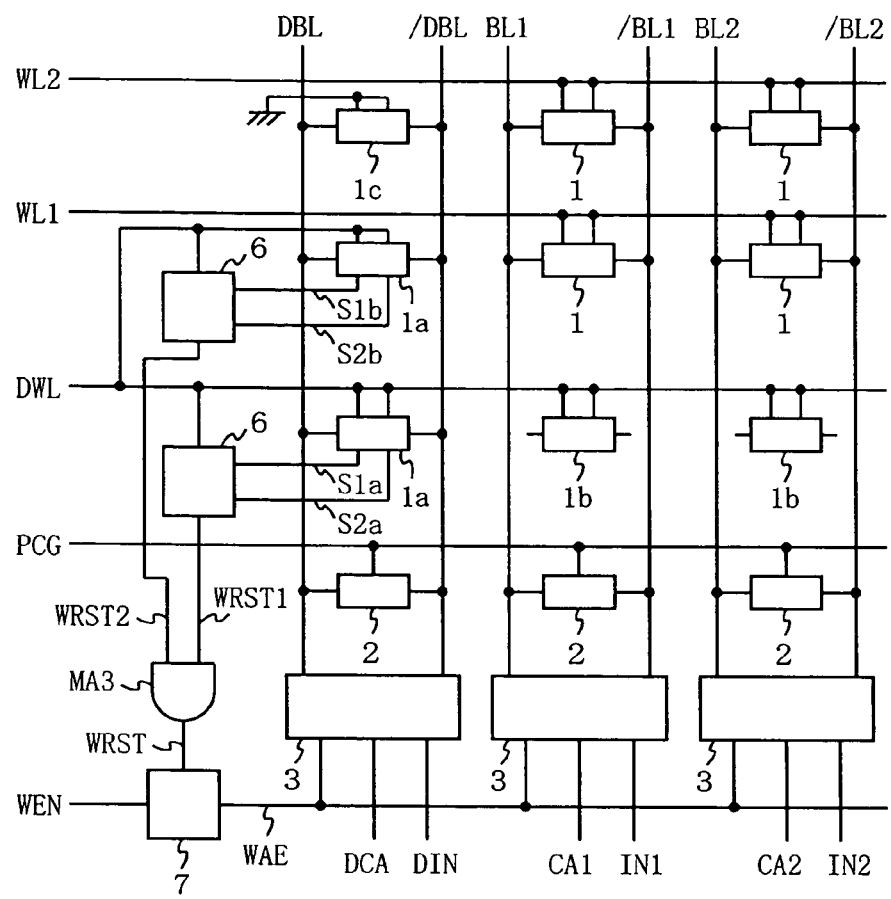
FIG. 7 is a structural diagram showing a semiconductor memory device according to a fourth embodiment of the present invention.
Figure 8:
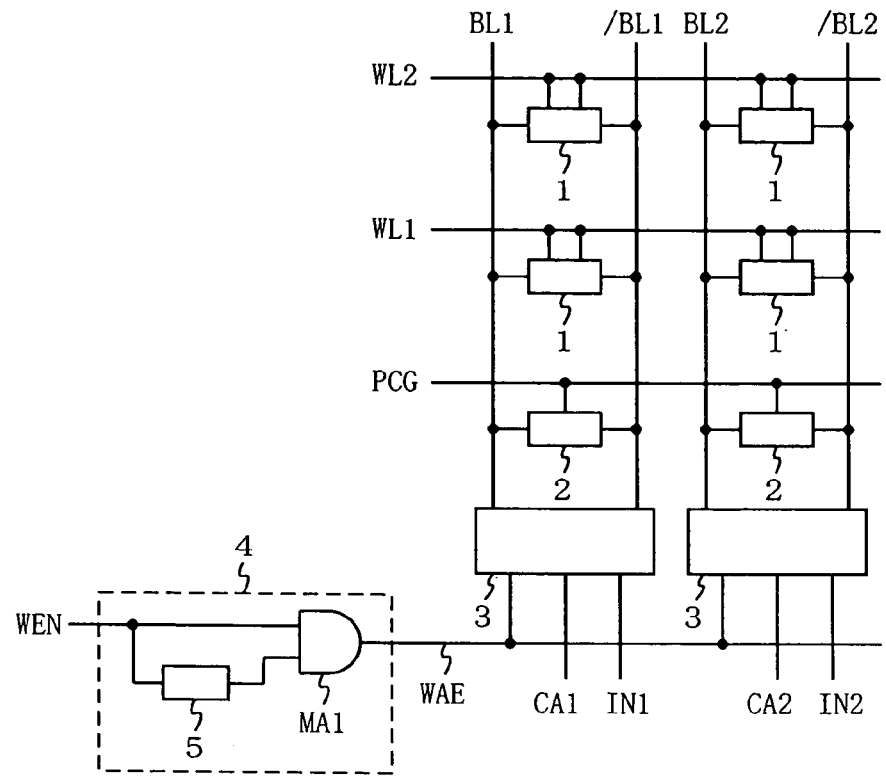
FIG. 8 is a structural diagram showing a conventional semiconductor memory device.

FIG. 7 is a structural diagram showing a semiconductor memory device according to a fourth embodiment of the present invention. The semiconductor memory device shown in FIG. 7 comprises memory cells 1, dummy memory cells 1a, 1b, and 1c, bit line precharge circuits 2, write amplifiers 3, memory cell storing node detection circuits 6, a write amplifier control circuit 7, and a 2-input AND circuit MA3. In FIG. 7 are shown: write completion signals WRST, WRST1 and WRST2; memory cell storing nodes S1a and S1b of one dummy memory cell 1a; and memory cell storing nodes S2a and S2b of the other dummy memory cell 1a. The other reference symbols are the same as those employed in the first embodiment.

In the present embodiment, the same circuits as those used in the conventional semiconductor memory device are employed as the memory cells 1, the bit line precharge circuits 2, and the write amplifiers 3. The details of the respective circuits have already been described above with reference to FIGS. 9 to 11, and the descriptions thereof are omitted here. For the dummy memory cells 1a to 1c, the memory cell storing node detection circuits 6, and the write amplifier control circuit 7, the same circuits as those used in the semiconductor memory device according to the first embodiment are employed. The details of these circuits have already been described in the first embodiment, and the descriptions thereof are omitted here.

The semiconductor memory device according to the present embodiment is identical to the semiconductor memory device of the first embodiment (FIG. 1) except that one of the dummy memory cells 1c is now replaced with a dummy memory cell 1a (resulting in a total of two dummy memory cells 1a), and that an additional memory cell storing node detection circuit 6 and an additional 2-input AND circuit MA3 are employed. It is assumed that the replacement of a dummy memory cell 1c with the dummy memory cell 1a does not affect the load on the dummy bit line pair {DBL and /DBL} in any way.

In the present embodiment, the two memory cell storing node detection circuits 6 and the 2-input AND circuit MA3 operate together as a write completion detection circuit. The two memory cell storing node detection circuits 6 respectively output write completion signals WRST1 and WRST2. The 2-input AND circuit MA3 derives a logic AND of the write completion signals WRST1 and WRST2, and outputs the derived logic AND as the write completion signal WRST.

Hereinafter, an operation of the semiconductor memory device according to the present embodiment having the above structure will be described. The semiconductor memory device of the present embodiment operates in a substantially identical manner to the semiconductor memory device of the first embodiment except for the following aspects. The semiconductor memory device of the present embodiment comprises two dummy memory cells 1a and two memory cell storing node detection circuits 6. The two memory cell storing node detection circuits 6 respectively output the write completion signals WRST1 and WRST2 based on the states of the memory cell storing nodes included in the respectively corresponding dummy memory cells 1a. The 2-input AND circuit MA3 derives a logic AND of the two write completion signals. Thus, the write completion detection circuit composed of the two memory cell storing node detection circuits 6 and the 2-input AND circuit MA3 shifts the write completion signal WRST to a value indicating write completion (H level) when the latest change among any changes in the states of the memory cell storing nodes in the two dummy memory cells 1a occurs.

Due to process fluctuations and the like, it is unlikely that all memory cells in a semiconductor memory device have completely identical properties, and therefore the memory cells may somewhat vary in write completion time. Accordingly, in the semiconductor memory device of the present embodiment, the write completion signal is shifted to a value indicating write completion only when the latest of any changes in the states of the memory cell storing nodes in the dummy memory cells 1a occurs, whereby a more reliable write timing can be obtained.

In the semiconductor memory device of the present embodiment, too, the memory cell storing node detection circuit 6 shown in FIG. 5 may alternatively be used as described in the second embodiment, and the dummy memory cell 1c shown in FIG. 6 may alternatively be used as described in the third embodiment. Furthermore, the semiconductor memory device of the present embodiment may comprise three ore more dummy memory cells 1a and three or more memory cell storing node detection circuits 6.

Each semiconductor memory device described above is illustrated as including only a small number of memory cells, dummy memory cells, word lines, bit line pairs, bit line precharge circuits, and write amplifiers, as shown in FIGS. 1 and 7. However, this is in order to facilitate understanding of the present invention, and it will be appreciated that a plurality (and in fact a multitude) of any such elements may be employed. The resultant semiconductor memory device will attain the same effects provided by the semiconductor memory device according to each embodiment above.

The semiconductor memory device according to the present invention may be a compilable memory in which the number of word lines and the number of bit lines can be configured in a variable manner. In a compilable memory, the number of dummy memory cells is increased or decreased in accordance with an increase or decrease in the number of memory cells; the loads on the word lines and the loads on the dummy word lines are similarly increased or decreased; and the loads on the bit line pairs and the load on the dummy bit line pairs are also similarly increased or decreased. Thus, the write timing for the memory cells and the write timing for the dummy memory cells are always maintained substantially identical, and therefore an optimum write timing can be obtained regardless of the configuration of the semiconductor memory device.

The semiconductor memory device according to the present invention is capable of generating an optimum write timing, and consumes relatively small power, and therefore is applicable to a variety of semiconductor devices, e.g., a memory device, a memory circuit, and a system device incorporating logic circuitry.

While the invention has been described in detail, the foregoing description is in all aspects illustrative and not restrictive. It is understood that numerous other modifications and variations can be devised without departing from the scope of the invention.

What is claimed is:

1. A semiconductor memory device including dummy memory cells, comprising:
    a plurality of word lines;
    a plurality of bit line pairs;
    a plurality of memory cells, each disposed at an intersection between one of the plurality of word lines and one of the plurality of bit line pairs;
    a dummy word line;
    a dummy bit line pair;
    a first dummy memory cell disposed at an intersection between the dummy word line and the dummy bit line pair;
    a plurality of second dummy memory cells, each disposed at an intersection between the dummy word line and one of the plurality of bit line pairs;
    a plurality of third dummy memory cells, each disposed at an intersection between one of the plurality of word lines and the dummy bit line pair;
    a plurality of bit line precharge circuits, each corresponding to the dummy bit line pair or one of the plurality of bit line pairs for controlling a precharge state of the respective line pair;
    at least one write amplifier for driving the dummy bit line pair and one of the plurality of bit line pairs to write data in a selected memory cell and the first dummy cell; and
    a write completion detection circuit for generating a write completion signal based on a change in a state of a storing node included in the first dummy memory cell.

2. The semiconductor memory device according to claim 1, wherein the state of the storing node included in the first dummy memory cell is initialized to a predetermined state when the dummy word line is driven.

3. The semiconductor memory device according to claim 1, wherein the dummy word line is driven only when one of the plurality of word lines is selected during a write operation, the dummy word line being driven in synchronization with the selected word line.

4. The semiconductor memory device according to claim 1, wherein the write completion detection circuit generates the write completion signal based on a change in a logic value on the storing node included in the first dummy memory cell.

5. The semiconductor memory device according to claim 4, wherein the write completion detection circuit includes an inverter circuit for receiving the logic value on the storing node included in the first dummy memory cell and outputting the write completion signal.

6. The semiconductor memory device according to claim 4, wherein,
   the write completion detection circuit includes:
      a first transistor having a source terminal which is connected to a power terminal and a gate terminal which is controlled based on the dummy word line;
      a second transistor having a source terminal which is connected to a drain terminal of the first transistor, and a gate terminal which is connected to the storing node included in the first dummy memory cell; and
      a third transistor having a source terminal which is grounded, a drain terminal which is connected to a drain terminal of the second transistor, and a gate terminal which is controlled based on the dummy word line, and
      the write completion detection circuit outputs, as the write completion signal, a state of the common drain terminal of the second and third transistors.

7. The semiconductor memory device according to claim 6, wherein a supply voltage is applied to the source terminal of the first transistor, the supply voltage being higher than a supply voltage which is supplied to the plurality of memory cells, the first to third dummy memory cells, and the plurality of bit line precharge circuits.

8. The semiconductor memory device according to claim 1, wherein the third dummy memory cell fixedly stores inverted data of write data for the first dummy memory cell.

9. The semiconductor memory device according to claim 1, comprising a plurality of said first dummy memory cells,
   wherein the write completion detection circuit shifts the write completion signal to a value indicating write completion when a latest change among any changes in the states of the memory cell storing nodes included in the plurality of first dummy memory cells occurs.

10. The semiconductor memory device according to claim 1, wherein the at least one write amplifier drives the bit line pair only while the write completion signal takes a value indicating incompletion of write during a write operation.

11. The semiconductor memory device according to claim 1, wherein a number of word lines and a number of bit lines can be configured in a variable manner as a compilable memory.

* * * * *